(12) United States Patent
Shirali et al.

(10) Patent No.: US 6,985,033 B1
(45) Date of Patent: Jan. 10, 2006

(54) CIRCUITS AND METHODS FOR ADJUSTING POWER AMPLIFIER PREDISTORTION, AND POWER AMPLIFIERS AND OTHER DEVICES INCLUDING THE SAME

(75) Inventors: Kedar Shirali, Sunnyvale, CA (US); King Chun Tsai, San Jose, CA (US); Wayne Loeb, San Francisco, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/753,007

(22) Filed: Jan. 6, 2004

Related U.S. Application Data

(60) Provisional application No. 60/470,627, filed on May 15, 2003.

(51) Int. Cl.
*H03F 1/26* (2006.01)
(52) U.S. Cl. .................. 330/149; 330/75; 375/297
(58) Field of Classification Search ............... 330/149, 330/75; 375/297
See application file for complete search history.

(56) References Cited

U.S. PATENT DOCUMENTS

| | | | |
|---|---|---|---|
| 5,760,646 A * | 6/1998 | Belcher et al. ............. | 330/149 |
| 6,304,140 B1 * | 10/2001 | Thron et al. ................ | 330/149 |
| 6,356,146 B1 | 3/2002 | Wright et al. | |
| 6,459,334 B2 | 10/2002 | Wright et al. | |
| 6,476,670 B1 | 11/2002 | Wright et al. | |
| 6,512,417 B2 | 1/2003 | Booth et al. | |

(Continued)

FOREIGN PATENT DOCUMENTS

EP     1 280 273 A2     1/2003

OTHER PUBLICATIONS

"802.16 IEEE Standard for Local and Metropolitan Area Networks; Part 16: Air Interface for Fixed Broadband Wireless Access Systems," 802.16 IEEE Standard for Local and Metropolitan Area Networks, Oct. 1, 2004, pp. i-xxxiv and pp. 1-857, IEEE Std 802.16-2004, IEEE, United States.

(Continued)

*Primary Examiner*—Patricia Nguyen

(57) ABSTRACT

An amplifier with adjustable (pre)distortion, a predistortion adjustment circuit, systems and networks including such amplifiers and circuits, and methods for adjusting (pre) distortion in an analog amplifier. The amplifier architecture generally includes (a) a predistortion circuit configured to (i) select a value for a predistortion function from a plurality of different predistortion values, and (ii) apply the selected predistortion value to an input signal to generate a predistorted input signal; (b) an amplifier configured to amplify the predistorted input signal and provide an output signal therefrom; and (c) an adjustment circuit configured to adjust selection of the predistortion function value in response to a predetermined parameter value of the amplifier. By adjusting the predistortion function, the amplifier provides an output signal in a linear power range over a range of amplifier parameter values and avoids overcompensation that can occur when the predistortion signal is not adjustable. Furthermore, the adjustments are made in response to changes in amplifier input and/or control parameters, enabling the amplifier to stay in the linear range, rather than respond to changes that first cause the amplifier to fall out of linearity. The systems generally include the architecture, circuit or an integrated circuit that embodies one or more of the inventive concepts disclosed herein. The methods generally include the steps of (1) predistorting an input signal in accordance with a digital predistortion function to provide a predistorted signal, (2) adjusting the digital predistortion function in response to a predetermined parameter value of an amplifier, and (3) amplifying the predistorted signal with the amplifier to produce the amplified signal.

64 Claims, 4 Drawing Sheets

U.S. PATENT DOCUMENTS

| | | |
|---|---|---|
| 6,545,535 B2 | 4/2003 | Andre |
| 6,600,792 B2 * | 7/2003 | Antonio et al. ............. 375/297 |
| 2002/0101937 A1 | 8/2002 | Antonio et al. |
| 2002/0186783 A1 | 12/2002 | Opas et al. |
| 2003/0063686 A1 | 4/2003 | Giardina et al. |
| 2003/0104794 A1 * | 6/2003 | Yang et al. ................. 455/118 |

OTHER PUBLICATIONS

IEEE Computer Society and the IEEE Microwave Theory and Techniques Society; "Part 16: Air Interface for Fixed Broadband Wireless Access Systems"; IEEE Standards for Local and Metropolitan Area Networks; Oct. 1, 2004; IEEE Std 802.16™-2004; Institute of Electrical and Electronics Engineers, Inc., New York, NY.

Wayne A. Loeb et al.; U.S. Application No. 10/776,476; Filed on Feb. 10, 2004 (Attorney Docket No. MP0351); Circuits, Software and Methods, for Adjusting Power Amplifier Predistortion, and Power Amplifiers and Other Devices Including the Same.

* cited by examiner

CIRCUITS AND METHODS FOR ADJUSTING POWER AMPLIFIER PREDISTORTION, AND POWER AMPLIFIERS AND OTHER DEVICES INCLUDING THE SAME

RELATED APPLICATIONS

This application claims the benefit of U.S. Provisional Application No. 60/470,627, filed May 15, 2003, which is incorporated herein by reference in its entirety. This application may also be related to U.S. application Ser. No. 10/776,476, filed on Feb. 10, 2004, and which is also incorporated herein by reference in its entirety.

FIELD OF THE INVENTION

The present invention generally relates to the field of amplification. More specifically, embodiments of the present invention pertain to circuitry, software, algorithms and methods for adjusting amplifier predistortion, amplifiers and amplifier architectures including such circuitry or operating in accordance with such software or methods, and devices, systems and networks including such circuitry, software or power amplifier(s).

DISCUSSION OF THE BACKGROUND

Referring to FIG. 1A, the power amplifier (PA) 10 is a circuit and/or device with inherently nonlinear input-output characteristics. As shown in FIG. 1B, the PA output voltage Vout as a function of PA input voltage Vin is generally linear to a point, and as Vin increases beyond that point, the curve becomes logarithmic (i.e., the increase in Vout per unit increase in Vin decreases; that is, d(Vout)/d(Vin) is negative). Thus, while the degree of nonlinearity may vary depending on the class of the amplifier, almost all PAs exhibit nonlinearity when operated at mid-to-high range of input power levels, due to saturation effects within the PA. The nonlinearity of the PA is a function of the input power (or input amplitude) and is characterized by the AM/AM and AM/PM curves, which model the distortion of the output amplitude and output phase, respectively, as a function of the input amplitude. Referring now to FIG. 2, when a PA input signal contains two sinusoid waveforms $\omega_0$ and $\omega_1$, the effects of the nonlinearity appear as intermodulation products ($\omega_0 - 2\omega_1$) and ($\omega_0 + 2\omega_1$). As shown in FIG. 3, such intermodulation products result in out-of-band spectral regrowth 20a and 20b and co-channel and/or adjacent channel interference 25, thereby significantly impacting system performance.

Highly linear PAs tend to be power inefficient. Therefore, they are generally not attractive for low power applications, such as wireless devices. As a result, the PAs designed for such applications tend to be power efficient, but they also tend to suffer from poor linearity. One way of avoiding the effect of PA-induced distortions is to operate with the input signal attenuated enough so that the region of operation is restricted to where the PA response is linear. However, this approach generally results in lower output power, and therefore, a lower output power range. The drawback of operating with an attenuated input signal becomes especially severe when the signal has a high peak-to-average power ratio (PAPR). In such a case, constraining the peak power to be within the linear regime of the PA response can adversely impact the average output power.

One preferred approach is to predistort the input signal to the PA to compensate for the non-linear effects. In other words, and as shown in FIG. 4, one designs a predistortion function 30 that is the mathematical inverse of the nonlinear characteristics 40 of the PA, such that the cascade of the predistortion function 30 and the PA results in a roughly linear amplification function of the amplitude of input signal IN, as observed at output OUT. The predistortion function 30 generally comprises prescaling the amplitude and changing the phase of a complex valued signal (e.g., IN) to compensate for the nonlinear amplitude dependent scaling (AM/AM) and phase rotation (AM/PM) effects introduced by the PA.

The predistortion function for a given PA characteristic also corresponds to a given operating point (e.g., desired output power). If the PA characteristic changes, then the predistortion function generally should change. Similarly, if the operating point is changed, but the PA characteristic is not changed, then the predistortion function should be adjusted accordingly. Otherwise, the signal can be overly predistorted for certain (generally higher) amplitudes and could actually result in an effective gain expansion type of nonlinearity.

For example, most conventional analog amplifier systems include a variable gain amplifier (VGA) configured to attenuate or restrict the voltage gain swing of a PA input signal. A VGA often limits the maximum value of Vin, usually to keep the PA in or near the linear region of operation. However, when the input signal Vin has a voltage that exceeds $\text{Vin}_{max}$ (see, e.g., Vin value 60 and its position relative to $\text{Vin}_{max}$ line 50 in FIG. 1B), the VGA reduces the value of Vin at the PA input to $\text{Vin}_{max}$, which results in the predistortion function (operating on the actual value, rather than the attenuated value, of Vin) overdistorting Vin and introducing gain expansion nonlinearity into the PA.

Thus, a need is felt for a circuit and method for (pre) distortion in an amplifier that provides a generally linear output power function over a range of amplifier operating parameters and a wider range of input power.

SUMMARY OF THE INVENTION

Embodiments of the present invention relate to an amplifier with adjustable predistortion, a circuit for making such adjustments, integrated circuits, systems and networks including such amplifiers and/or circuits, and methods, software and algorithms for adjusting predistortion in an amplifier. The adjustable amplifier generally comprises (a) a predistortion circuit configured to (i) select a value for a predistortion function from a plurality of different predistortion values, and (ii) apply the selected predistortion value to an input signal to generate a predistorted input signal; (b) an amplifier configured to amplify the predistorted input signal and provide an output signal therefrom; and (c) an adjustment circuit configured to adjust selection of the predistortion function value in response to a predetermined parameter value of the amplifier. The adjustment circuit generally comprises (1) a memory configured to store a plurality of different sets of digital predistortion values for a digital predistortion function, each of the different sets of digital predistortion values having an address; (2) a first mathematical operator circuit configured to mathematically apply the digital predistortion function to an input signal to produce a predistorted signal; and (3) an offset circuit configured to generate an offset for the address in response to a predetermined amplifier parameter value. The systems generally comprise an integrated circuit (IC) that includes the present amplifier circuit and/or architecture embodying one or more of the inventive concepts disclosed herein. The methods generally comprise the steps of (i) predistorting an input signal in accordance with a digital predistortion function to provide a predistorted signal, (ii) adjusting the digital predistortion function in response to a predetermined parameter value of an amplifier, and (iii) amplifying the predistorted signal with the amplifier to produce the amplified signal.

The present invention advantageously provides an adjustment by which the range of predistortion function values is limited to those that are allowed by or consistent with amplifier parameter restrictions. By limiting the predistortion function values to those applicable to "allowed states" under predetermined amplifier operating conditions (e.g., parameter values), the present invention avoids overcompensating for "disallowed" (and usually high voltage or high current) amplifier input signal states, and extends the linear range of operation for an amplifier. Furthermore, when the restrictions relate to amplifier input or control parameters, the invention advantageously adjusts predistortion before the amplifier falls out of linearity. By contrast, approaches that adjust predistortion based on an amplifier output parameter generally cannot make an appropriate adjustment or change in the predistortion function until after the amplifier is out of linearity. These and other advantages of the present invention will become readily apparent from the detailed description of preferred embodiments below.

DETAILED DESCRIPTION OF THE PREFERRED EMBODIMENTS

Figure 1A:
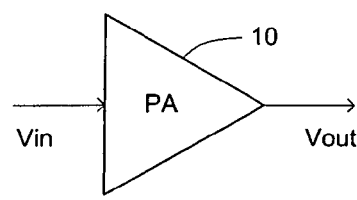
FIG. 1A is a diagram showing a simple power amplifier.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller, circuit, circuit block and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "time," "rate," and "frequency" are generally used interchangeably herein, but are generally given their art-recognized meanings. Also, for convenience and simplicity, the terms "data," "data stream," "signal," "waveform" and "information" may be used interchangeably, as may the terms "lines," "conduits," "traces," "wires," "busses," "paths" and "channels," but these terms are also generally given their art-recognized meanings. Furthermore, the phrases "connected to," "coupled with," "coupled to" and grammatical variations thereof may refer to direct and/or indirect connections and/or couplings, unless the context specifies a more limited meaning. In addition, the term "differential" signal generally refers to a signal transmitted along two separate, but complementary, lines where the value of the data in the signal may be determined at least in part by the difference between the values of voltages or relative voltage levels on the complementary lines. The terms "adjustable," "programmable," "tunable" and "configurable" are also generally interchangeable within the context of this description and generally refer to a circuit or circuit element that has a plurality of possible settings or values, one of which becomes operable (or fixed or established) in response to a particular state of a single- or multi-bit control signal or memory element, but these terms also generally are given their art-recognized meanings.

The present invention concerns an amplifier with adjustable predistortion, generally comprising (a) a predistortion circuit configured to (i) select a value for a predistortion function from a plurality of different predistortion values, and (ii) apply the selected predistortion value to an input signal to generate a predistorted input signal; (b) an amplifier configured to amplify the predistorted input signal and provide an output signal therefrom; and (c) an adjustment circuit configured to adjust selection of the predistortion function value in response to a predetermined parameter value of the amplifier. An exemplary circuit for adjusting predistortion in an amplifier generally comprises (1) a memory configured to store a plurality of different sets of digital predistortion values for a digital predistortion function, each of the different sets of digital predistortion values having an address; (2) a first mathematical operator circuit configured to mathematically apply the digital predistortion function to an input signal to produce a predistorted signal; and (3) an offset circuit configured to generate an offset for the address in response to a predetermined amplifier parameter value. The systems generally comprise an integrated circuit (IC) that includes the present amplifier and/or adjustment circuit, embodying one or more of the inventive concepts disclosed herein.

Even further aspects of the invention concern a method of adjusting an amplifier, comprising the steps of (i) predistorting an input signal in accordance with a digital predistortion function to provide a predistorted signal, (ii) adjusting the digital predistortion function in response to a predetermined parameter value of an amplifier, and (iii) amplifying the predistorted signal with the amplifier to produce the amplified signal. The invention also relates to software and algorithms configured to implement the method, which may further include tables of data correlating (1) predistortion adjustment increments with changes in amplifier parameter values and/or (2) predistortion function values with an input signal value.

The invention, in its various aspects, will be explained in greater detail below with regard to exemplary embodiments.

Exemplary Power Amplifiers with Adjustable Predistortion

In one aspect, the present invention relates to an amplifier circuit with adjustable (pre)distortion, generally comprising (a) an amplifier configured to amplify an analog input signal and provide an output signal therefrom; (b) a predistortion circuit configured to (i) select a value for a digital predistortion function from a plurality of different digital predistortion values, and (ii) apply the selected digital predistortion value to the analog input signal; and (c) a control circuit configured to control selection of the predistortion function value in response to a predetermined parameter value of the amplifier. In one preferred embodiment, the amplifier comprises a variable gain amplifier (VGA) and a power amplifier (PA). In other preferred embodiments, the amplifier parameters are generally input and/or control parameters, as opposed to output parameters. In yet further preferred embodiments, the control circuit may comprise an address offset calculator and/or generator, and the present predistortion circuit may comprise a memory configured to store different sets of digital predistortion values and provide a selected set for use in the predistortion function in response to the input signal. These embodiments (and others) will be explained below in greater detail and with reference to the drawings.

Figure 5:
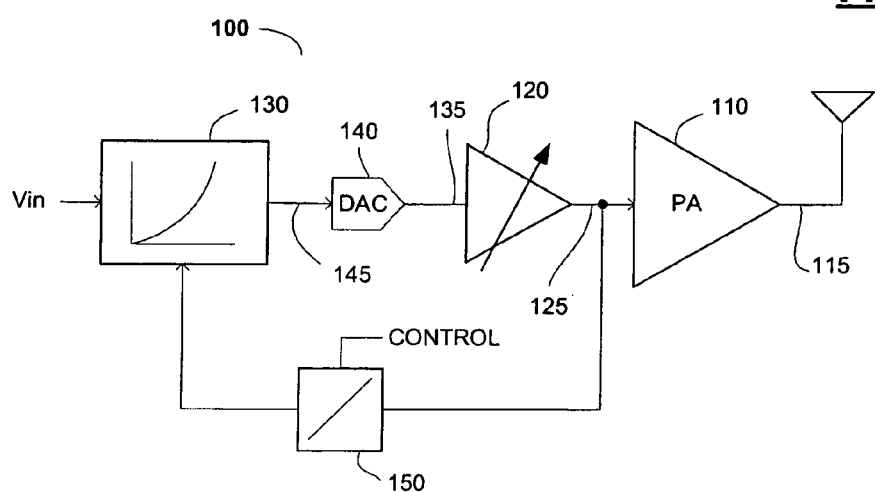
FIG. 5 is a block-level diagram of an embodiment of the present amplifier.

FIG. 5 shows an amplifier architecture 100. The architecture shown includes power amplifier 110, variable gain amplifier (VGA) 120, predistortion circuit 130, digital-to-analog converter (DAC) 140, predistortion control/adjustment circuit 150 and transmission antenna 160. Power amplifier 110, VGA 120, DAC 140 and antenna 160 are generally conventional, although power amplifier 110 may comprise a segmented power amplifier as described in U.S. application Ser. No. 10/776,476, filed on Feb. 10, 2004, the relevant portions of which are incorporated herein by reference.

Predistortion functions and circuits are well known in the art. Generally, a predistortion circuit comprises (i) a memory (or "look up table") storing different sets of values for the predistortion function, and (ii) logic configured to select a particular set of predistortion function values, depending on the value of the amplifier input signal Vin. The present invention generally adds or incorporates a minimal amount of extra logic and programming to existing predistortion circuits to accomplish its benefits and solve the overcompensation problem of previous predistortion approaches.

For example, referring to FIG. 5, predistortion adjustment/control circuit 150 receives PA input information 125 (which can also be considered VGA information) and control information CONTROL, then generates or produces a predistortion adjustment signal 155 that adjusts the predistortion function of predistortion circuit 130 in response to PA input information 125 and control information CONTROL. Generally, control information relates to information (i) that includes the predetermined value of an amplifier parameter, or (ii) from which the parameter value can be obtained or calculated. Furthermore, predistortion circuit 130 may receive amplifier information other than PA input information 125 from which the parameter value can be obtained or calculated, generally in combination with the control information (e.g., when the control information does not include the parameter value[s]).

Figure 6:
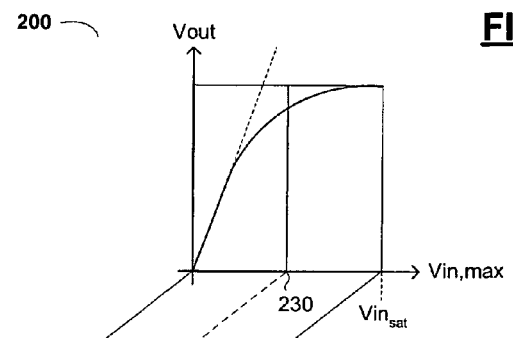
FIG. 6 shows a general approach to linearizing a power amplifier output function by correlating the maximum value of the PA input voltage, $Vin_{max}$, to an address in a memory or table storing predetermined values for an amplifier input predistortion function.

The operation of the amplifier 100 of FIG. 5 can be explained with additional reference to the graph 200 of FIG. 6, using an exemplary implementation. FIG. 6 shows a graph 200 plotting the native (non-predistorted) output Vout of PA 110 (see FIG. 5) as a function of Vin. Vout reaches a maximum actual value ($Vout_{max}$) at the saturation point of the power amplifier, $Vin_{sat}$. Thus, one can correlate predistortion circuit memory addresses 0 through $2^n-1$ (plotted along line 210 in FIG. 6) to a number of discrete values of Vin from 0 to $Vin_{sat}$, and store appropriate predistortion function values in memory 220 at those addresses so that Vout is generally a linear function of Vin over the range of from 0 to $Vin_{sat}$.

As described above, to avoid nonlinearity problems (as well as limitations to the amplification of high voltage input signals by the power amplifier), VGA 120 (see FIG. 5) may be used to attenuate Vin. In one example, VGA 120 attenuates Vin by half, resulting in a maximum amplitude of $Vin_{sat}/2$ (see line 230 in FIG. 6, which corresponds to address $2^{(n-1)}-1$ [line 240] in memory 220). The invention (in this example) thus limits the range of predistortion function values to those from address 0 to address $2^{(n-1)}-1$ in memory 220, thereby solving possible overdistortion problems that would otherwise arise when Vin>$\text{Vin}_{sat}/2$.

The operation of the circuit of FIG. 5 is as follows. Predistortion control/adjustment circuit 150 receives data from VGA 120 on output bus 125 and a control signal CONTROL (although the VGA data may be sent on a different bus other than the bus providing the input to PA 110 and may come from a source other than VGA 120, such as amplifier programming information that is stored in a memory). In this example, the control signal comprises a maximum value of the VGA gain and the predetermined amplifier parameter value comprises a scaling factor (e.g., the Vin attenuation, or the actual VGA gain compared to the theoretical maximum VGA gain). However, the predetermined amplifier parameter value may comprise any determinable amplifier parameter, such as (i) PA gain, (ii) PA and/or VGA input power, (iii) an amplifier (preferably PA) input current, (iv) an amplifier (PA and/or VGA) input voltage range, and/or (v) a PA input impedance, in which case the adjustment circuit input signal and the control signal may respectively comprise (i) Vin and a maximum value of Vin (e.g., $\text{Vin}_{sat}$), (ii) actual amplifier input power (or power supply Vcc/Vdd) and a reference voltage, (iii) actual amplifier input current (e.g., from a current mirror) and a reference current, (iv) actual amplifier input power (or power supply Vcc/Vdd) and two reference voltages, the highest and lowest values in the allowed range, and/or (v) the actual PA input impedance and either a reference resistance (modeling the target or desired input impedance) or the PA output impedance (for impedance matching purposes).

From the predetermined amplifier parameter information (in the example of FIG. 6, a VGA scaling factor of 0.5 or $\text{Vin}_{sat}/2$), the adjustment circuit (e.g., predistortion control/adjustment circuit 150 in FIG. 5) calculates an appropriate adjustment to be made to the predistortion circuit so as not to overcompensate for Vin values greater than $\text{Vin}_{sat}/2$. The adjustment is generally one that prevents or disallows the predistortion circuit from applying a set of predistortion values stored at an address in memory 220 corresponding to Vin values greater than those that are possible under operating conditions employed (in this example, greater than $\text{Vin}_{sat}/2$). A preferred way to accomplish such an adjustment is to add or subtract an address offset value to the memory address conventionally determined by the actual Vin value, where the offset value correlates to the attenuation of Vin. Such an approach is described in greater detail with respect to FIGS. 7–9 below. Alternatively, logic can be added to disallow access to those addresses that correspond to a value of Vin (or other parameter for which a predistortion function can have a plurality of different programmable and/or selectable [sets of] values) that would be a "disallowed state" under the amplifier operating conditions (e.g., Vin>$\text{Vin}_{sat}/2$ is a "disallowed state" when the VGA scaling factor is set to 0.5; an applied voltage of 2.8 V is a "disallowed state" when the amplifier operating voltage is set to 2.5 V; an efficiency of 15% is a "disallowed state" when the amplifier efficiency is set to be from 20% to 25%; etc.).

Referring back to FIG. 5, predistortion circuit makes the adjustment to its function in accordance with adjustment signal 155 and outputs a predetermined set of predistortion function values (as adjusted) corresponding to the amplifier input signal value Vin. The digital predistortion function values to be applied to the amplifier input signal are converted into an analog signal or waveform by DAC 140, then the analog signal 135 is mathematically combined (generally, by multiplication) with the amplifier input signal to produce a predistorted amplifier input signal. By limiting the predistortion function values to those applicable to "allowed states" under predetermined amplifier operating conditions (e.g., parameter values), the present invention avoids overcompensating for "disallowed" (and usually high voltage or high current) amplifier input signal states.

Figure 7:
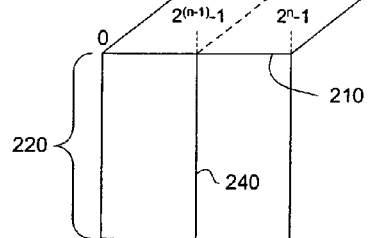
FIG. 7 is a diagram of an embodiment of the present predistortion circuit.
Figure 7:
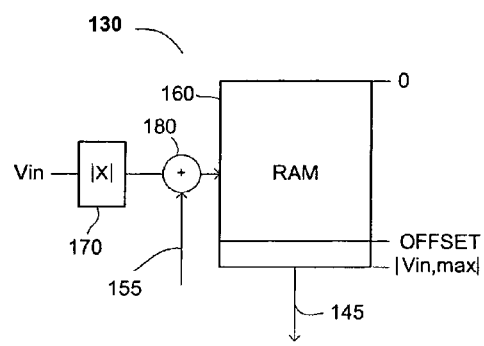

FIG. 7 shows a simplified embodiment of the predistortion circuit 130 of FIG. 5. Predistortion circuit 130 generally comprises random access memory (RAM) 160, a voltage-dependent address generator 170 (typically an analog-to-digital converter having the same bit width as the addresses in RAM 160), and mathematical operator circuit 180. As explained above, address generator 170 generates an address in RAM 160 corresponding to a voltage value of input signal Vin, consistent with conventional "look up table" approaches to applying digital predistortion to analog signals to be amplified. However, in the present invention, the address generated by address generator 170 is then mathematically combined with the adjustment signal 155 (in this example, an address offset signal) to select an "allowed" predistortion function state for a given amplifier parameter setting or range of allowed values. As shown in FIG. 7, in a preferred embodiment, the mathematical operator circuit 180 comprises an adder (or subtractor, depending on the polarity or value of the adjustment).

For example, and now referring back to FIG. 5, if VGA 120 is configured to attenuate input signal Vin, then one knows that the attenuated input signal has an amplitude lower than nondistorted input signal Vin. Thus, the predistortion function values (which may be most easily determined and programmed for Vout as a function of native, nondistorted Vin) stored at predetermined addresses in RAM 160 (see FIG. 7) can be offset by a value corresponding to the attenuation of Vin. Adjustment circuit 150 may then be configured to simply add or subtract a digital address "offset" to the address generated by address generator 170 to arrive at a predistortion function value that corresponds to the Vin value as modified by VGA 120.

For example, assume that Vin is attenuated by an amount sufficient to take the amplifier out of the saturation region. As shown in FIG. 7, when Vin=$\text{Vin}_{max}$, address generator 170 generates an address in RAM 160 corresponding to $\text{Vin}_{max}$. However, the attenuation (which reduces Vin to some value less than $\text{Vin}_{max}$) results in an address offset 155 that changes the address generated by address generator 170 to an offset value OFFSET, corresponding to a Vin value less than $\text{Vin}_{max}$. Of course, logic can be added that either prohibits an address offset greater than the address corresponding to the nondistorted Vin value, or that sets any negative address that may result from combining the address generated by address generator 170 and an address offset to an "all zeros" address.

Figure 8:
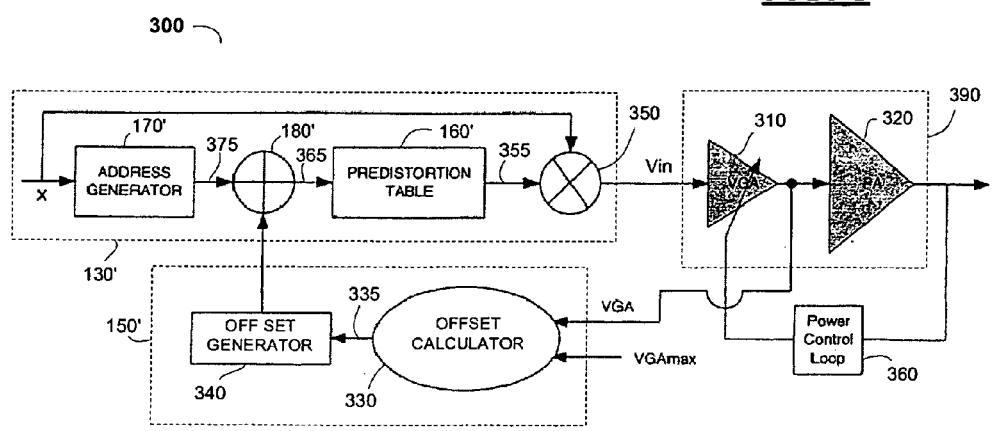
FIG. 8 is a block-level diagram of a second embodiment of the present amplifier.

FIG. 8 shows another embodiment of the present amplifier with adjustable predistortion 500. Amplifier 500 generally comprises power amplifier 510, VGA 520, power control loop 560 (for positive and/or negative feedback from the PA 510 output to VGA 520), predistortion adjustment circuit 150', and predistortion circuit 130'. Predistortion adjustment circuit 150' generally comprises offset calculator 530 and offset generator 540, and predistortion circuit 130' generally comprises predistortion table 160', address generator 170', adder circuit 180' and mathematical operator circuit 550. Power amplifier 510 and VGA 520 are generally as described above.

In this embodiment, an analog data stream X (or other analog waveform) is received by predistortion circuit 130'. Address generator 170' generates an address for predistortion table 160' based on the amplitude of X at a given point in time, similar to the embodiment of FIG. 7. Adder 180' receives the address 575 generated by address generator 170' and adds an address offset (which may be positive, negative or zero) from offset generator 540 to address 575. Adjusted address 565 is sent to predistortion table 160' (which stores various sets of predistortion function values), which produces predistortion factor 555 (generally after conversion to an analog value or waveform) that is then applied to analog data stream X by mathematical operator circuit 550. In this example, mathematical operator circuit 550 comprises a multiplier, but other circuits configured to operate mathematically on an analog signal (such as adders and integrators) may be used and/or included as well. The predistorted analog data signal, represented by Vin' in FIG. 8, is input into amplifier 590 for amplification.

Predistortion circuit 150' receives amplifier information signal VGA from the output of VGA 510 and maximum VGA gain setting signal VGA max from, e.g., either the VGA or a memory storing such information for setting and/or controlling the amplifier configuration and/or VGA parameter(s). Offset calculator 530 is generally an analog comparator (typically an analog comparator that may further include an analog-to-digital converter (ADC) and possibly other digital logic) configured to produce a signal 535 representing a difference in value(s) between the amplifier information signal (e.g., VGA) and a reference or control signal (e.g., VGAmax). Offset generator 540 receives signal 535 and generates a digital address offset signal 545 in response thereto. Offset generator 540 typically comprises a look up table having offset values correlated to possible values of signal 535. When signal 535 is an analog signal, offset generator 540 typically includes an ADC configured to convert signal 535 into a digital signal for use in the look up table in offset generator 540.

Exemplary Circuitry for Adjusting Predistortion in a Power Amplifier

In another aspect, the invention relates to a circuit, comprising (1) a memory configured to store a plurality of different sets of digital predistortion values for a digital predistortion function, each of the different sets of digital predistortion values having an address; (2) a digital-to-analog converter (DAC) configured to (i) receive a selected set of digital predistortion values and (ii) apply the digital predistortion function to an analog input signal; and (3) an offset circuit configured to generate an offset for the address in response to a predetermined amplifier parameter value.

Figure 9:
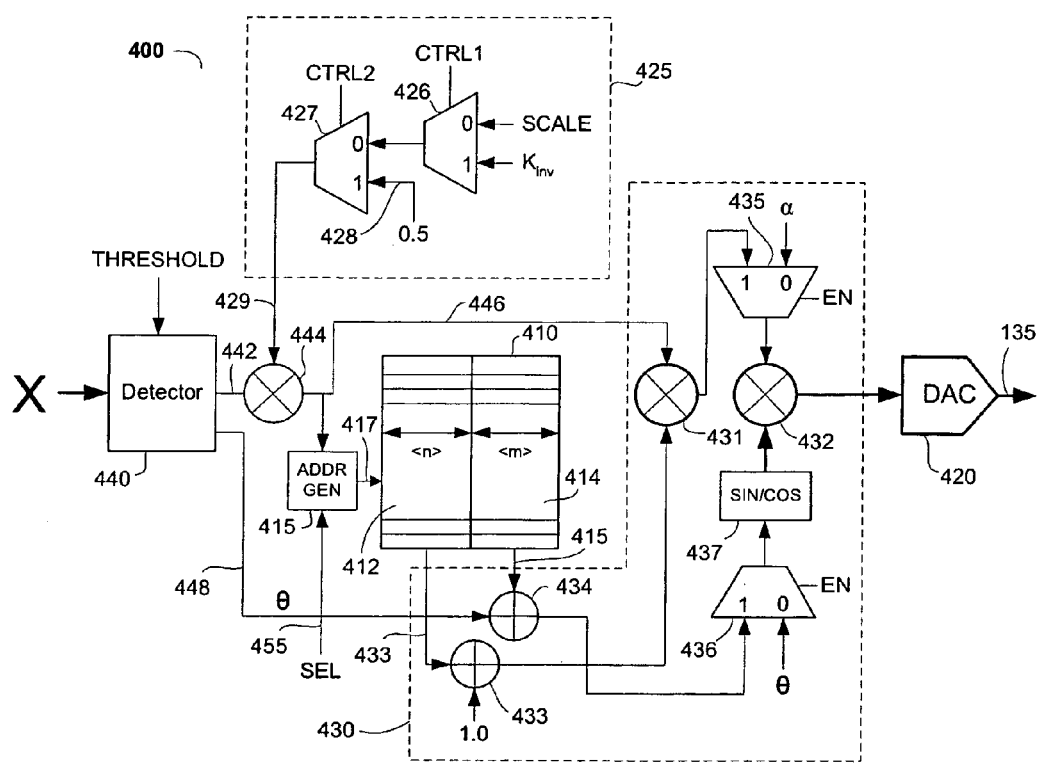
FIG. 9 is a detailed schematic of a second embodiment of the present predistortion circuit.

FIG. 9 shows an exemplary adjustable predistortion circuit 400, comprising predistortion table 410, address generator 415, DAC 420, amplifier information control circuit 425, and mathematical operator logic 430. The adjustable predistortion circuit 400 is an alternative to the predistortion circuits 130 and 130' of FIGS. 5, 7 and 8.

The input signal X passes through a conventional threshold detector 440, which can be positive or negative or both, and which generally passes the input signal X to its output except when the input signal X exceeds a threshold (e.g., when the input signal X has a value greater than $Vin_{max}$, or less than the minimum Vin value for which a non-zero predistortion function value would be applied), in which case the threshold detector 440 outputs a predetermined signal value (e.g., a digital "1" or "0," or a minimum or maximum analog value). The data output 442 of threshold detector 440 is then multiplied in multiplier 444 by a control signal 429, generated by amplifier information control circuit 425, to produce a non-predistorted data signal 446 that is received by (i) mathematical operator logic 430 for generation of analog predistortion signal 135 and (ii) address generator 415. Since multiplier 444 multiplies the data signal by a digital control signal value, to the extent detector 440 converts the input signal into a digital signal on node 442, multiplier 444 can be replaced with digital logic (e.g., AND gates) that provide the same mathematical result as multiplying by 1 or 0.

Amplifier information control circuit 425 generally comprises multiplexer 426 and multiplexer 427, configured to receive a plurality of digital amplifier information control signals. Two multiplexers are used in the circuit 425 of FIG. 9, largely because three amplifier information control signals are used to determine the output state of circuit 425. Where only two information control signals determine the output state of circuit 425, a single multiplexer would be suitable. Multiplexers 426–427 can be also replaced by conventional digital logic, configured to provide a mathematically equivalent result.

In FIG. 9, multiplexer 426 receives two inputs, a first parameter information signal (in one implementation, a first scaling factor SCALE that may be programmable or static) and a second parameter information signal (in this embodiment, a dynamic scaling factor $K_{inv}$ configured to scale the input signal X to maximize the dynamic range of the predistorter 400; in one implementation, $K_{inv}$ is a reciprocal of the small-signal gain of the power amplifier 320 of FIG. 8). If the amplifier configuration uses the dynamic parameter value, the control signal CTRL1 into multiplexer 426 is set to "1," and $K_{inv}$ is selected. If, for example, the amplifier configuration uses a configurable parameter value (e.g., one that is programmed into a memory used to configure the amplifier), the control signal CTRL1 is set to "0," and the configurable parameter value is selected.

Multiplexer 427 receives the output of multiplexer 426 and a default parameter value (in this implementation, a default scaling value 0.5). If the amplifier configuration uses the default parameter value, the control signal CTRL2 into multiplexer 426 is set to "1," and the default parameter value is selected. If the amplifier configuration uses the non-default parameter value selected by multiplexer 426, the control signal CTRL1 is set to "0," and the non-default parameter value is selected. Thus, the output 429 from amplifier information control circuit 425 represents a control signal generated in response to amplifier parameter information and/or values that modify an analog input signal, pass it through to downstream circuitry unmodified, or prevent it from being passed to downstream circuitry.

Address generator 415 receives non-predistorted data signal 446 and address offset signal SEL (e.g., from offset generator 340 in FIG. 8). In the embodiment of FIG. 9, address generator 415 produces an address for table 410 corresponding to an amplitude (or value) of non-predistorted data signal 446, then mathematically combines (and preferably adds) the address offset SEL to the generated address to produce an adjusted predistortion table address 417. Predistortion table 410 outputs two sets of predistortion function values stored at adjusted predistortion table address 417, a first set to predistort the input signal amplitude and a second set to predistort the input signal phase. Thus, predistortion table 410 may store multiple sets of predistortion function values that affect different components of the analog input signal (in this case, amplitude and phase). Furthermore, the invention may comprise a plurality of predistortion tables, each storing predistortion functions for different amplifier parameter settings (in which case, duplicate parameter adjustment circuitry, address generators, and mathematical operator logic may be necessary as well for implementation). Referring now to FIG. 8, the Vin outputs of the duplicate predistortion circuits 130' would then be multiplied by an analog weighting factor (which can be determined in accordance with conventional weighting algorithms), and the weighted outputs summed with a conventional summing circuit, to produce a predistorted analog amplifier input signal.

Referring back to FIG. 9, predistortion table 410 comprises a first portion 412 containing n bit-wide amplitude predistortion values and a second portion 414 containing m bit-wide phase predistortion values. The specific values of n and m may vary, but are generally selected in accordance with the number of possible (or discrete) parameter values and/or the granularity with which accompanying hardware and/or software can process the predistortion function data. In response to adjusted address 417, table 410 outputs (i) an n bit-wide amplitude predistortion value to an amplitude path within mathematical operator circuit 430 and (ii) an m bit-wide phase predistortion value to a phase path within mathematical operator circuit 430.

The amplitude path in mathematical operator circuit 430 comprises an amplitude factor adjustment circuit 433, a multiplier 431 and a multiplexer 435. Amplitude factor adjustment circuit 433 mathematically applies an amplitude factor to the n bit-wide amplitude predistortion value output from table 410. As shown in FIG. 9, the amplitude factor is 1.0 (but other values could easily be implemented, depending on application and/or design preferences), and amplitude factor adjustment circuit 433 comprises an adder. However, amplitude factor adjustment circuit 433 can easily comprise other or additional mathematical circuits (such as a multiplier or integrator), according to design preferences. The adjusted amplitude predistortion value is input into multiplier 431 along with non-predistorted data signal 446 to generate predistorted data signal 438. Multiplexer 435 selects predistorted data signal 438 or native input signal α (which, in one embodiment, represents the amplitude of the input signal; note that the input signal may be predistorted in polar coordinates to facilitate amplitude scaling and phase rotation), depending on the state of a predistortion enable signal EN, for input into a phase adjustment circuit 432.

The phase path in mathematical operator circuit 430 comprises a phase predistortion circuit 434, a multiplexer 436 and a sinusoidal waveform generator 437, which in one embodiment is configured to generate sin(x) and cos(x) values for phase rotation of the signal selected by multiplexer 436. Phase predistortion circuit 433 mathematically applies the m bit-wide phase predistortion value output from table 410 to a phase component θ of the input signal. As shown in FIG. 9, phase predistortion circuit 434 comprises an adder, but can easily comprise other or additional mathematical circuits (such as a multiplier or integrator), according to design preferences. Multiplexer 436 selects predistorted phase component 439 or the native phase component θ, depending on the state of predistortion enable signal EN, for phase rotation and input into a phase adjustment circuit 432.

When predistortion is enabled, phase adjustment circuit 432 applies the phase predistortion waveform from waveform generator 437 to predistorted data signal 438, generating a predistorted digital waveform, which is then converted by DAC 420 to the analog amplifier input signal 135 (see FIG. 5). Thus, the predistortion circuit refinements exemplified in FIG. 9 include (i) a threshold detector for processing the predistortion circuit input signal, (ii) an amplifier information control signal for modifying and/or gating the input data (or data component of the input signal), (iii) separate amplitude and phase paths for application of separate predistortion functions thereto, and (iv) a control signal configured to turn predistortion on or off.

An Exemplary Integrated Circuit

In another aspect, the present invention concerns an integrated circuit (IC) that includes an adjustable amplifier, such as the exemplary architectures of FIG. 5 or 8, or the exemplary circuitry of FIG. 9. In a preferred embodiment, the integrated circuit comprises the present amplifier with adjustable predistortion and a transmitter communicatively coupled to the adjustable amplifier, the transmitter being configured to transmit the analog signal to an external receiver. The present IC may comprise further components, such as the present predistortion circuit and/or predistortion adjustment circuit, an impedance matching network and/or a modulator or low pass filter, the latter two in their conventional configurations in a transmitter. Furthermore, the components in the present IC may operate on differential or single-ended signals.

The present integrated circuit is particularly suitable for high-speed, wireless applications. In various embodiments, the present integrated circuit comprises a transceiver compatible with and/or configured to communicate data in substantial accordance and/or compliance with a protocol defined and/or described in the Institute of Electrical and Electronic Engineers (IEEE) 802.11, 802.11a, 802.11b, 802.11g and/or 802.16 standards. As a result, the analog signal transmitted and/or amplified by the present IC may have a frequency of about 900 KHz or more, preferably at least about 1 GHz, more preferably of at least about 2.4 GHz.

The System and a Wireless Network

In a further aspect of the present invention, the system is configured to transmit and/or receive data communications in a wireless network. The system generally comprises the above-described integrated circuit, a signal converter configured to provide a converted analog output signal from the output signal of the adjustable amplifier, and a transmission antenna configured to broadcast the converted analog output signal. In one embodiment (and as described above), the signal converter may comprise a transformer.

Figure 1B:
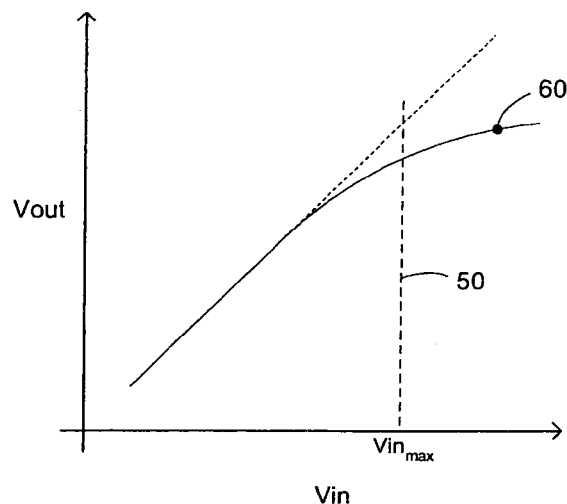
FIG. 1B is a graph showing the native (unmodified) output voltage as a function of input voltage for the power amplifier of FIG. 1A.
Figure 2:
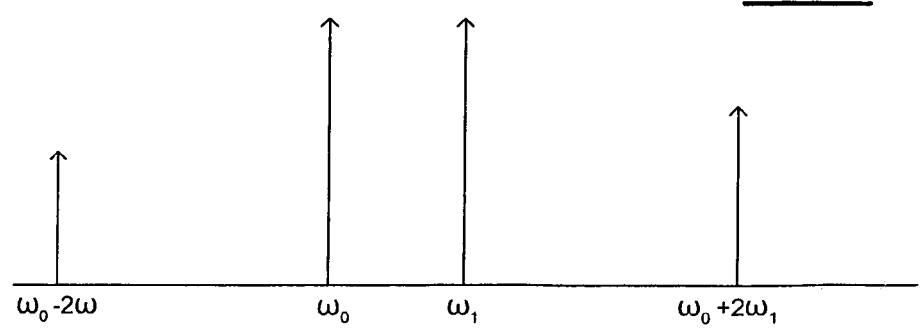
FIG. 2 is a graph showing undesired harmonics that can appear in a power amplifier output in which the input signal is overdistorted.
Figure 3:
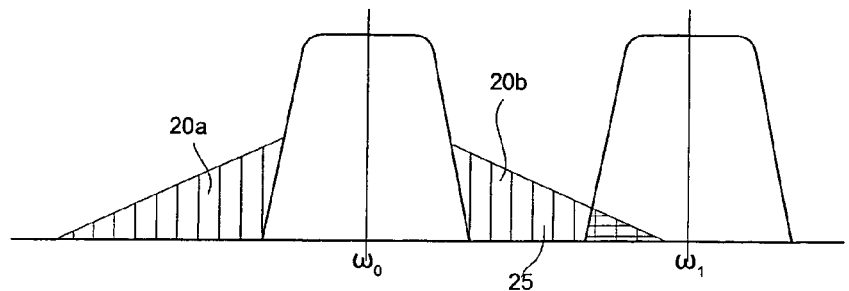
FIG. 3 is graph showing spectral growth and channel interference in a power amplifier output in which the input signal is overdistorted.
Figure 4:
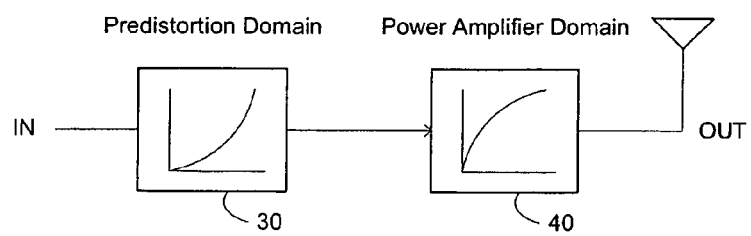
FIG. 4 shows a general approach to linearizing the output of a power amplifier using input predistortion.

The present system generally includes an output (impedance) matching network, such as the matching network described in U.S. application Ser. No. 10/776,476, filed on Feb. 10, 2004, the relevant portions of which are incorporated herein by reference. Thus, in one embodiment, the system further comprises an output capacitor and/or an output inductor coupled to an output transmission node (e.g., Vout in FIG. 1, or node 115 in FIG. 5), and/or an adjustable resistor coupled to the output inductor (or to the output transmission node in the absence of the output inductor). Preferably, the system further comprises at least the output capacitor and the output inductor coupled to the output transmission node.

In yet further embodiments of the system, the output signal may comprise a differential signal, and system may further comprise a signal converter configured to convert the differential signal to a single-ended signal. In such differential output embodiments, the system may further comprise first and second output capacitors and/or first and second output inductors, respectively coupled to each line of the differential output signal; first and second adjustable resistors, respectively coupled to the first and second output inductors (or to each line of the differential output signal in the absence of the output inductors); and/or a differential output capacitor, respectively coupled to each line of the differential output signal. Preferably, the differential output system further comprises at least a first output capacitor and a first output inductor coupled to a first differential output signal line, a second output capacitor and a second output inductor coupled to a second differential output signal line, and the differential output capacitor in communication with the ends of the first and second output inductors opposite those coupled to the differential output signal lines.

The present invention also relates to a network, comprising the present system, and a receiver in electromagnetic communication with the system. Since the present invention enjoys particular applicability to wireless data (and, alternatively, voice and/or video) communications, the network may further comprise a receiving antenna in communication with the receiver.

Alternatively, the network may comprise a plurality of the present systems, and a plurality of receivers, each of the receivers being in communication with at least one of the systems. In such a network, at least one of the systems is in communication with at least two of the receivers and/or at least two of the systems are in communication with at least one of the receivers.

An Exemplary Method of Adjusting Amplifier Predistortion

The present invention further relates to a method of producing an amplified signal, comprising the steps of (1) predistorting an input signal in accordance with a digital predistortion function to provide a predistorted signal; (2) adjusting the digital predistortion function in response to a predetermined parameter value of an amplifier; and (3) amplifying the predistorted signal with the amplifier to produce the amplified signal.

While the operation of the present circuitry is generally described above, in one implementation, the predistorting step comprises applying a set of digital predistortion values to the input signal. In further embodiments, the method further comprises selecting the set of digital predistortion values from a plurality of different sets of digital predistortion values, and the selecting step may comprise generating an address at which the set of digital predistortion values are stored, where the address corresponds to a value of the input signal. Also, the adjusting step may comprise changing the address by a predetermined increment in response to the predetermined parameter value (in which case the method may focus on or include only those steps relating to adjusting predistortion in a power amplifier, and may omit the amplifying step and [optionally] even the predistorting step). Alternatively or additionally, the present method may further comprise the step(s) of attenuating the predistorted signal.

Furthermore, and as explained above, the input and/or output signal may have a minimum frequency of about 1 GHz, preferably about 2.4 GHz, and the predetermined amplifier parameter value may comprise a scaling factor, an amplifier gain, an input power, an input current, an input voltage range or an input impedance, preferably a scaling factor.

An Exemplary Algorithm and Software

Although the description herein tends to focus on methods and hardware (e.g., architectures, systems and/or circuits), the present invention also includes a computer program and/or software, implementable and/or executable in a general purpose computer or workstation equipped with a conventional digital signal processor, configured to perform one or more steps of the method and/or one or more operations of the hardware. Thus, a further aspect of the invention relates to software that implements the above method and/or algorithm. For example, the invention may further relate to a computer program, computer-readable medium or waveform containing a set of instructions which, when executed by an appropriate signal processing device, is configured to perform the above-described method and/or algorithm. Furthermore, the software may further include the data constituting the predistortion function and/or to the data in an adjustment look up table (e.g., in the offset calculator) that correlates a change in the amplifier parameter value to an adjustment (e.g., an address offset) to be made in the predistortion function.

Thus, in certain embodiments, the present computer-readable medium or waveform includes digital predistortion function data that comprises a plurality of different sets of digital predistortion values, each of which may be correlated to a particular value or range of values of input signal. In one implementation, the correlation is accomplished by an address at which the set of digital predistortion values are stored that corresponds to the value or range of values of the input signal.

In other embodiments, the computer-readable medium or waveform further comprises a table storing a plurality of predetermined adjustments to the predistortion function, correlated to a change in the predetermined parameter value. As described above, the predetermined amplifier parameter value may comprise a scaling factor, an amplifier gain, an input power, an input current, an input voltage range or an input impedance, but preferably comprises a scaling factor.

The waveform is generally configured for transmission through an appropriate medium, such as copper wire, a conventional network cable, a conventional optical data transmission cable, or even air or a vacuum (e.g., outer space) for wireless signal transmissions. The waveform and/or code are generally digital, and are generally configured for processing by a conventional digital data processor (e.g., a microprocessor, microcontroller, or logic circuit such as a programmable gate array, programmable logic circuit/device or application-specific [integrated] circuit).

An Exemplary Implementation

The predistortion operation in the data path involves prescaling the amplitude of the complex valued input signal to compensate for the amplitude scaling (AM/AM) effects of the PA and/or rotating the phase of the input signal to compensate for the AM/PM effects of the PA. The values of the prescaling and rotation factors depend on the amplitude of the input signal.

The predistortion values are stored as a lookup table in a SRAM that is 32 bits wide and 64 words deep, although other widths and depths are certainly applicable. The 32 bits are split into 14 bits for the AM/AM table and 18 bits for the AM/PM table, although other allocations between amplitude scaling and phase rotation are certainly applicable. The predistortion operation in the data path generally uses only the 9 MSBs of the AM/AM table and 10 MSBs of the AM/PM table. The extra precision in the tables (which is not required for general functionality of the invention) may benefit certain adaptation algorithms used for the predistortion tables.

The AM/AM prescaling factor in this implementation is constrained to be $\geq 1.0$ and <2.0, and therefore may focus the predistortion function on compensating for gain compression effects, while limiting the loss of the DAC quantization to 1 bit. The amplitude of the clipped signal is used to derive the address that is to be used to access the lookup table (and thus, the contents) of the predistortion SRAM. The nonlinearity of the PA is more pronounced at higher amplitudes, and therefore, higher granularity of the predistortion tables for larger amplitudes is generally desired. Higher granularity is provided by storing the predistortion values indexed to be linear in power. A schematic of the predistortion function as applied to an amplifier circuit and/or system is shown in FIG. 8.

The predistortion function is derived for a particular PA configuration (or characteristic) which depends on desired range of output power from the PA. A power amp can be characterized by its maximum output power $V_{max}$. Therefore, the computed predistortion function is dependent on the maximum power output of the PA. Lower output powers can be obtained by scaling the PA input signal level. A desired output power level can be obtained by setting the PA to a certain configuration and then adjusting the input signal level. In such an approach, the predistortion values should be adjusted to account for the scaling of the signal levels at the PA input. If this is not done, the signals may be excessively predistorted and could result in a gain expansion effect (assuming the PA has a gain compression nonlinearity).

This implementation presents a relatively simple mechanism to adjust the predistortion to account for the scaling of the signals at the PA input. The following discussion describes the predistortion mechanism and explains how it works.

Predistortion Configuration

The values of the predistortion AM/AM and AM/PM tables to be selected depend on the PA characteristics, which may be, in turn, determined by the PA configuration or parameter setting(s). Each unique PA configuration corresponds to a different PA characteristic, which can be measured and therefore known a priori. The predistortion AM/AM and AM/PM tables are computed for each PA configuration and are provided as binary data files which can be loaded into the predistortion SRAM. Besides loading the predistortion SRAM with the appropriate AM/AM and AM/PM values for predistortion, the following parameters may be programmed: the digital scale of the predistortion function (e.g., SCALE in FIG. 9), the change in address corresponding to a unit value change in scaling (e.g., SEL in FIG. 9), and an enable signal (e.g., EN in FIG. 9) configured to turn off or disable the predistortion circuit and/or adjustment circuit under certain predetermined conditions, such as the PA operating exclusively in the linear region (i.e., at sufficiently low input power that the predistortion function has substantially no effect).

The digital scale of the predistortion function may be set by a 10 bit register (although, naturally, other register sizes and even other memory means, such as latches, may be used) that scales the amplitude of the signal going into the predistorter 400. The scaling is a means to controlling the power out of the PA, and comprises a digital counterpart of the VGA gain that precedes the PA. The default value for the digital gain is 0.5 (see, e.g., input 4xx to mux 4xx in FIG. 9), by which setting the predistortion function can predistort the signal by a maximum value of 2.0. Equivalently, the predistortion function is capable of handling up to 6 dB of gain compression.

Gain Change Compensator

The PA can operate over a wide range of output powers. By default, the PA is set to output the maximum power for which it is configured. Lower operating power is achieved by scaling the input signal using the VGA (e.g., VGA 120 in FIG. 5 or VGA 510 in FIG. 8). When a predistortion function compensates for the PA nonlinearity, the scaling of the signals at the PA input is compensated by scaling the input to the predistorter as well. This can be done by setting the values of the individual words in the digital scaling register to appropriate values, or by adding an appropriate offset to the amplitude dependent addresses generated to access the contents of the predistortion RAM 160 (see FIG. 7). The invention operates by adding an offset to the addresses in the predistortion RAM 160, and optionally in conjunction with setting the digital scale values appropriately.

The scaling at the PA input in this implementation is affected by a VGA which has a minimum resolution of 0.5 dB. Therefore, in an optional embodiment, the predistortion scaling can be effected by an equivalent scaling factor for the digital scale value selected from the scale register. However, this implementation of the invention computes the change in RAM 160 address that a 0.5 dB scaling will generate, then subtracts this numerical address change from 10 every address generated by RAM address generator 415 to access the predistortion RAM 160. This is done by setting an address offset parameter (e.g., SEL in FIG. 9). In one implementation, the offsets take the values shown in Table 1 below.

TABLE 1

Offset values.

| VGA Change (dB) | Address Offset |
| --- | --- |
| 0 | 0 |
| 0.5 | 7 |
| 1.0 | 13 |
| 1.5 | 18 |
| 2.0 | 23 |
| 2.5 | 28 |
| 3.0 | 32 |
| 3.5 | 35 |
| 4.0 | 38 |
| 4.5 | 41 |
| 5.0 | 44 |
| 5.5 | 46 |
| 6.0 | 48 |
| 6.5 | 63 (no predistortion) |
| 7.0 | 63 (no predistortion) |
| 7.5 | 63 (no predistortion) |

Note that when VGA gain (signal attenuation) is greater than 6 dB, the PA is substantially in the linear region, and therefore, no predistortion is needed. When the PA 520 (see FIG. 8) is operating at the maximum power level supported by the PA configuration (Vmax), the address offset SEL is set to 0. If the VGA gain setting is denoted by $VGA_{max}$, the appropriate value for the VGA gain VGA will be based on the desired output power level. For every 0.5 dB drop in VGA gain setting, the address offset value SEL is incremented by 1. The address offset value SEL to be programmed into offset generator 530 by offset calculator 540 can be determined by the following formula (1):

$$SEL = \text{integer}((VGA_{max} - VGA)/0.5) \quad (1)$$

In this implementation, the default value of address offset SEL is 0, and it can take maximum increments of 15.

CONCLUSION/SUMMARY

Thus, the present invention provides an adjustable predistortion circuit, systems including such an amplifier, and methods for adjusting an analog signal using such a (pre)distortion circuit. The systems generally comprise an integrated circuit (IC) that includes the present circuit. The present invention advantageously provides a power amplifier that operates linearly over a large output power range and that does not consume an inordinate amount of chip area.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit, comprising:
   a) a predistortion circuit configured to (i) select a value for a predistortion function from a plurality of different predistortion values, and (ii) apply said selected predisposition value to an input signal to generate a predistorted input signal;
   b) an amplifier configured to amplify said predistorted input signal and provide an output signal therefrom; and
   c) an adjustment circuit configured to adjust selection of said predistortion function value in response to a predetermined parameter value of said amplifier.

2. A circuit, comprising:
   a) a predistortion circuit configured to (i) select a value for a predistortion function from a plurality of different predistortion values, and (ii) apply said selected predisposition value to an input signal to generate a predistorted input signal;
   b) a variable gain amplifier configured to amplify said predistorted input signal and provide a scaled output signal therefrom; and
   c) an adjustment circuit configured to adjust selection of said predistortion function value in response to a predetermined parameter value of said amplifier.

3. The circuit of claim 2, further comprising a power amplifier configured to receive said scaled output signal and provide a transmitter output signal therefrom.

4. The circuit of claim 1, wherein said predistortion circuit (i) selects a set of programmed values for said predistortion function from a plurality of different sets of programmed predistortion values, and (ii) applies said selected set of predistortion values to said input signal.

5. The circuit of claim 4, wherein each of said different sets of predistortion values has a unique address.

6. The circuit of claim 5, further comprising a memory array configured to store each of said different sets of predistortion values at a corresponding unique memory address.

7. The circuit of claim 6, wherein said memory array comprises a random access memory.

8. The circuit of claim 5, wherein said control circuit comprises an offset circuit configured change said address by a predetermined increment in response to said predetermined parameter value of said amplifier.

9. The circuit of claim 1, wherein said predetermined parameter value of said amplifier comprises a scaling factor, an amplifier gain, an input power, an input current, an input voltage range or an input impedance.

10. The circuit of claim 9, wherein said predetermined parameter value of said amplifier comprises a scaling factor.

11. A circuit, comprising:
   a) a predistortion circuit configured to (i) select a value for a predistortion function from a plurality of different predistortion values, and (ii) apply said selected predistortion value to an input signal to generate a predistorted input signal;
   b) an amplifier configured to amplify said predistorted input signal and provide an output signal therefrom; and
   c) an adjustment circuit configured to adjust selection of said predistortion function value in response to a variable gain amplifier scaling factor.

12. The circuit of claim 9, wherein said predetermined parameter value of said amplifier comprises a gain, an input power, an input current, an input voltage range or an input impedance of a power amplifier.

13. The circuit of claim 4, wherein each of said sets of predistortion values comprises a digital predistortion values, said circuit further comprising (d) a mathematical operator circuit configured to apply digital predistortion values to said input signal, and (e) a digital-to-analog converter configured to convert said digitally predistorted signal to a predistorted analog signal.

14. An integrated circuit, comprising:
   a) the circuit of claim 1; and
   b) a transmitter communicatively coupled to said amplifier, said transmitter being configured to transmit said output signal to an external receiver.

15. The integrated circuit of claim 14, wherein said analog signal has a frequency of at least about 1 GHz.

16. An integrated circuit, comprising:
   a) a predistortion circuit configured to (ii) select a value for a predistortion fusion from a plurality of different predistortion values, and (ii) apply said selected predistortion value to an input signal to generate a predistorted input signal;
   b) an amplifier configured to amplify said predistorted input signal and provide an output signal therefrom;
   c) an adjustment circuit configured to adjust selection of said predistortion function value in response to a predetermined parameter value of said amplifier;
   d) a transmitter communicatively coupled to said amplifier, said transmitter being configured to transmit said output signal to an external receiver; and
   e) an impedance matching network, a modulator and/or a low pass filter.

17. The integrated circuit of claim 14, wherein sad integrated circuit is at least compatible with at least one Institute of Electrical and Electronic Engineers (IEEE) standard 802.11, 802.11a, 802.11b, 802.11g and 802.16.

18. A system for broadcasting an analog signal, comprising:
   a) the integrated circuit of claim 14; and
   b) a transmission antenna configured to broadcast said output signal.

19. The system of claim 18, further comprising a signal converter configured to provide a converted analog output signal from said output signal.

20. The system of claim 19, wherein said output signal comprises a differential signal, and said signal converter is configured to convert said differential signal to a single-ended analog signal.

21. A network, comprising:
   a) the system of claim 18; and
   b) a receiver in electromagnetic communication with said system.

22. The network of claim 21, further comprising a receiving antenna in communication with said receiver.

23. A network, comprising:
   a) a plurality of the systems of claim 18; and b) a plurality of receivers, each of said receivers being in communication with at least one of said systems.

24. The network of claim 23, wherein at least one of said systems is in communication with at least two of said receivers.

25. The network of claim 23, wherein at least two of said systems are in communication wit at least one of said receivers.

26. A circuit, comprising:
a) means for predistorting an input signal to provide a predistorted signal;
b) means for amplifying said predistorted signal; and
c) means for adjusting said means for predistorting based on a predetermined parameter value of said means for amplifying.

27. A circuit, comprising:
a) means for predistorting an input signal to provide a predistorted signal;
b) means for amplifying said predistorted signal; and
c) means for adjusting said means for predistorting based on a predetermined parameter value of said means for amplifying, comprising a means for attenuating said predistorted signal.

28. The circuit of claim 27, wherein said means for amplifying further comprises a power amplifier configured to provide an amplified output signal from said attenuated, predistorted signal.

29. The circuit of claim 26, wherein said means for predistorting comprises (i) a means for selecting a set of digital predistortion values from a plurality of different set of digital predistortion values, and (ii) a means for applying said selected set of digital predistortion values to said input signal.

30. The circuit of claim 29, further comprising a means for storing each of said different sets of digital predistortion values at a corresponding unique address.

31. The circuit of claim 30, wherein said means for adjusting comprises a means for changing said address by a predetermined increment in response to said predetermined parameter value.

32. The circuit of claim 29, further comprising (d) a means for converting said predistorted signal to a predistorted analog signal, and (e) a mathematical operator circuit configured to apply said set of digital predistortion values to said input signal.

33. An integrated circuit, comprising:
a) the circuit of claim 26; and
b) a means for transmitting said amplified, predistorted signal.

34. The integrated circuit of claim 33, wherein said input signal has a frequency of at least about 1.0 GHz.

35. The integrated circuit of claim 33, wherein said integrated circuit is at least compatible with at least one Institute of Electrical and Electronic Engineers (IEEE) standard 802.11, 802.11a, 802.11b, 802.11g and 802.16.

36. A system, comprising:
a) the integrated circuit of claim 33; and
b) a means for broadcasting said amplified, predistorted signal.

37. The system of claim 36, further comprising a means for providing a broadcast output signal from said amplified, predistorted signal.

38. A system, comprising:
a) means for predistorting an input signal to provide a predistorted signal;
b) means for amplifying said predistorted signal;
c) means for adjusting said means for predistorting based on a predetermined parameter value of said means for amplifying;
d) a means for transmitting said amplified, predistorted signal, wherein said amplified, predistorted signal comprises a differential signal, and said means for transmitting further comprises a means for converting said differential signal to a single ended signal; and
e) a means for broadcasting said amplified, predistorted signal.

39. A network, comprising:
a) the system of claim 37; and
b) a means for receiving said broadcast output signal, in communication with said system.

40. The network of claim 39, further comprising a means for processing said broadcast output signal received by said means for receiving, wherein said means for processing is in communication with said means for receiving.

41. A network, comprising:
a) a plurality of the systems of claim 37; and
b) a plurality of means for receiving said broadcast output signal, each of said means for receiving being in communication with at least one of said systems.

42. The network of claim 41, further comprising a plurality of means for processing said broadcast output signal received by said means for receiving, wherein each of said means for processing is in communication with a unique one of said means for receiving.

43. The network of claim 41, wherein at least one of said systems is in communication with at least two of said means for receiving.

44. The network of claim 41, wherein at least two of said systems are in communication with at least one of said means for receiving.

45. A circuit, comprising:
a) a memory configured to store a plurality of different sets of digital predistortion values for a digital predistortion function, each of said different sets of digital predistortion values having an address;
b) a first mathematical operator circuit configured to mathematically apply said digital predistortion function to an input signal to produce a predistorted signal; and
c) an offset circuit configured to generate an offset for said address in response to a predetermined amplifier parameter value.

46. The circuit of claim 45, wherein each address stores (i) a first set of digital predistortion values configured to predistort an amplifier component of said input signal and (ii) a second set of digital predistortion values configured to predistort a phase component of said input signal.

47. The circuit of claim 45, further comprising a digital-to-analog converter (DAC) configured to receive said predistorted signal.

48. The circuit of claim 45, further comprising a second mathematical operator circuit configured to mathematically apply an amplifier information control signal to said input signal.

49. A circuit, comprising:
a) a means for storing a plurality of different sets of digital predistortion values for a digital predistortion function;
b) a means for selecting one of said different sets of digital predistortion values;
c) a first means for mathematically applying said digital predistortion function to an input signal to produce a predistorted signal; and
d) a means for adjusting said means for selecting in response to a predetermined amplifier parameter value.

50. The circuit of claim 49, wherein each set of digital predistortion values comprises (i) a first subset of digital predistortion values configured to predistort an amplitude component of said input signal and (ii) a second subset of digital predistortion values configured to predistortion a phase component of said input signal.

51. The circuit of claim 49, further comprising a means for converting a digital predistorted signal to an analog signal.

52. The circuit of claim 49, for comprising a second means for mathematically applying an amplifier information control signal to said input signal.

53. A method of producing an amplified signal, comprising the steps of:
   a) predistorting an input signal in accordance with a digital predistortion function to provide a predistorted signal;
   b) adjusting said digital predistortion function in response to a predetermined parameter value of an amplifier; and
   c) amplifying said predistorted signal with said amplifier to produce said amplified signal.

54. A method of producing an amplified signal, comprising the steps of:
   a) predistorting an input signal in accordance with a digital predistortion function to provide a predistorted signal;
   b) attenuating said predistorted signal;
   c) adjusting said digital predistortion function in response to a predetermined parameter value of an amplifier; and
   d) amplifying said predistorted signal with said amplifier to produce said amplified signal.

55. The method of claim 53, wherein said predistorting comprises applying a set of digital predistortion values to said input signal, and said method further comprises selecting said set of digital predistortion values from a plurality of different sets of digital predistortion values.

56. The method of claim 55, wherein said selecting comprises generating an address at which said set of digital predistortion values are stored, said address corresponding to a value of said input signal.

57. The method of claim 56, wherein said adjusting comprises changing said address by a predetermined increment in response to said predetermined parameter value.

58. The method of claim 53, wherein said predetermined amplifier parameter value comprises a scaling factor, an amplifier gain, an input power, an input current, an input voltage range or an input impedance.

59. The method of claim 58, wherein said predetermined parameter value of said amplifier comprises a sealing factor.

60. The method of claim 53, wherein said amplified signal has a minimum frequency of about 1 GHz.

61. A method of predistorting an input signal, comprising:
   a) storing a plurality of different sets of digital predistortion values for a digital predistortion function, each of said different sets of digital predistortion values having an address;
   b) selecting one of said different sets of digital predistortion values;
   c) mathematically applying said digital predistortion function to said input signal to produce a predistorted signal; and
   d) generating, an offset for said address in response to a predetermined amplifier parameter value.

62. The method of claim 61, wherein each address stores (i) a first set of digital predistortion values configured to predistort an amplitude component of said input signal and (ii) a second set of digital predistortion values configured to predistort a phase component of said input signal.

63. The method of claim 61, wherein said predistorted signal comprises a predistorted analog signal, and said method further comprises converting said predistorted analog signal to a predistorted digital signal.

64. The method of claim 61, further comprising mathematically applying an amplifier information control signal to said input signal.

* * * * *